US010551445B2

(12) United States Patent
Vijayakumar

(10) Patent No.: US 10,551,445 B2
(45) Date of Patent: Feb. 4, 2020

(54) PULSE WIDTH MODULATED BINARY FREQUENCY SHIFT KEYING

(71) Applicant: Infineon Technologies AG, Neubiberg (DE)

(72) Inventor: Prasanna Venkateswaran Vijayakumar, Bangalore (IN)

(73) Assignee: Infineon Technologies AG, Neubiberg (DE)

( * ) Notice: Subject to any disclaimer, the term of this patent is extended or adjusted under 35 U.S.C. 154(b) by 233 days.

(21) Appl. No.: 15/382,861

(22) Filed: Dec. 19, 2016

(65) Prior Publication Data

US 2018/0177022 A1   Jun. 21, 2018

(51) Int. Cl.
*H05B 37/02* (2006.01)
*G01R 31/44* (2006.01)
*H02J 1/00* (2006.01)
*H02P 7/00* (2016.01)

(52) U.S. Cl.
CPC ............... *G01R 31/44* (2013.01); *H02J 1/00* (2013.01); *H02P 7/00* (2013.01); *H05B 37/0263* (2013.01)

(58) Field of Classification Search
CPC ............ H05B 33/0809; H05B 33/0827; H05B 33/0845; H05B 37/0254; H05B 37/0263; H05B 37/0281; H05B 37/029; H05B 37/032; H05B 37/034
USPC ........................................ 315/185 R, 307, 312
See application file for complete search history.

(56) References Cited

U.S. PATENT DOCUMENTS

| | | | | |
|---|---|---|---|---|
| 2011/0089847 A1* | 4/2011 | Qin | ..................... | H05B 37/0263 315/246 |
| 2012/0068608 A1* | 3/2012 | Covaro | ..................... | G01J 1/18 315/151 |
| 2012/0280565 A1* | 11/2012 | Logvinov | .......... | H05B 37/0254 307/31 |
| 2012/0323394 A1* | 12/2012 | Gandhi | .............. | H05B 33/0857 700/297 |

(Continued)

OTHER PUBLICATIONS

"Lighting control system." Wikipedia. https://en.wikipedia.org/wiki/Lighting_control_system. 4 pages.

(Continued)

*Primary Examiner* — Tung X Le
(74) *Attorney, Agent, or Firm* — Eschweiler & Potashnik, LLC

(57) ABSTRACT

A control system that facilitates energy efficient management of building automation systems is disclosed. The control system comprises a source circuit configured to generate a modulated DC control signal comprising data modulated on a DC source signal having a power associated therewith and a load circuit configured to receive the modulated DC control signal. In addition, the control system comprises a transmission circuit comprising a DC powerline, coupled between the load circuit and the source circuit, and configured to transfer the modulated DC control signal from the source circuit to the load circuit, thereby multiplexing both the power and the data transfer over the DC powerline. In some embodiments, a frequency of the modulated DC control signal comprises a first information associated with the data, and a pulse width of the modulated DC control signal comprises a second, different information associated with the data.

16 Claims, 7 Drawing Sheets

(56) References Cited

U.S. PATENT DOCUMENTS

2013/0249429 A1* 9/2013 Woytowitz ......... H05B 37/0263
        315/246
2013/0320862 A1* 12/2013 Campbell ............. H05B 37/02
        315/152

OTHER PUBLICATIONS

"Digital Addressable Lighting Interface." Wikipedia. https://en.wikipedia.org/wiki/Digital_Addressable_Lighting_Interface. 6 pages.

* cited by examiner

PULSE WIDTH MODULATED BINARY FREQUENCY SHIFT KEYING

FIELD

The present disclosure relates to the field of building automation and control, and more specifically to a method and an apparatus for improving energy efficiency of systems used in building management control systems.

BACKGROUND

Building Automation Systems (BAS) are centralized, interlinked, networks of hardware and software, which monitor and control the environment in commercial, industrial, and institutional facilities. While managing various building systems, the automation system ensures the operational performance of the facility as well as the comfort and safety of building occupants. With the advent of internet of things (IoT), there is a growing opportunity in integrating building automation systems and IoT that facilitates a more integrated approach to automation. An important consideration in the area of building automation and control is the energy efficiency of the building automation systems.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
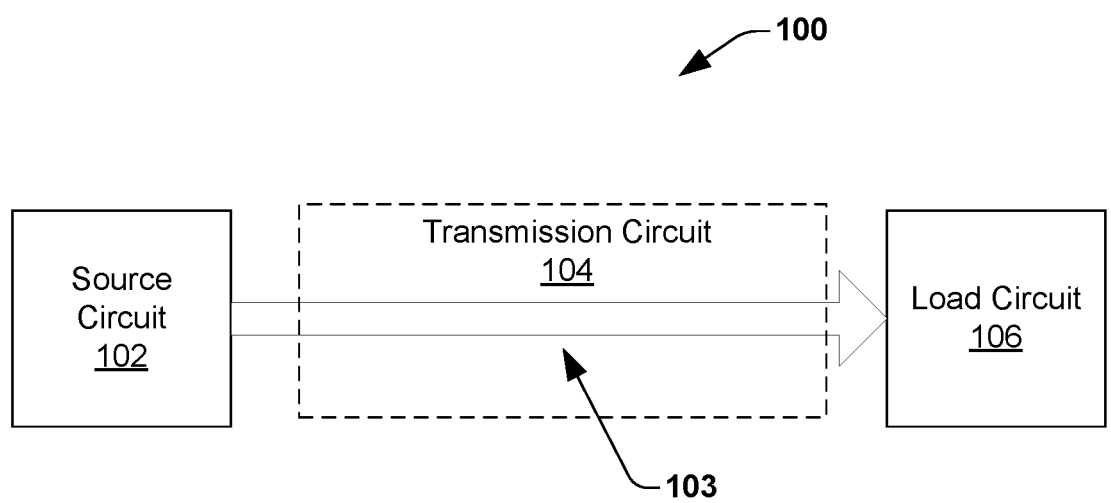
FIG. 1 illustrates a simplified block diagram of a control system, according to one embodiment of the disclosure.

In one embodiment of the disclosure, a direct current (DC) control system is disclosed. The DC control system comprises a source circuit configured to generate a modulated DC control signal comprising data modulated on a DC source signal having a power associated therewith and a load circuit configured to receive the modulated DC control signal. The DC control system further comprises a transmission circuit comprising a DC powerline, coupled between the load circuit and the source circuit, and configured to transfer the modulated DC control signal from the source circuit to the load circuit, thereby multiplexing both the power and the data transfer over the DC powerline, wherein a frequency of the modulated DC control signal comprises a first information associated with the data, and a pulse width of the modulated DC control signal comprises a second, different information associated with the data.

In one embodiment of the disclosure, a method for a direct current (DC) control system is disclosed. The method comprises modulating a frequency of a carrier signal at a control circuit, to encode a first information associated with a data, comprising an address information associated with a load circuit in a first instance and a control information associated with the load circuit in a second instance, on to the carrier signal. The method further comprises modulating a pulse width of the carrier signal at the control circuit, to encode a second information associated with the data, comprising the control information associated with the load circuit in the first instance and the address information associated with the load circuit in the second instance, on to the carrier signal, in order to generate a modulated carrier signal comprising the data.

In one embodiment of the disclosure, a lighting control system is disclosed. The lighting control system comprises a power supply circuit configured to generate a DC source signal having a power associated therewith and a control circuit coupled to the power supply circuit and configured to generate a modulated DC control signal comprising data modulated on the DC source signal. The lighting control system further comprises a lighting circuit, comprising one or more lighting control circuits, configured to receive the modulated DC control signal over a DC powerline coupled between the control circuit and the lighting circuit, thereby multiplexing both the power and the data over the DC powerline, wherein a frequency of the modulated DC control signal comprises an address information associated with the lighting circuit, and a pulse width of the modulated DC control signal comprises a dimming information associated with the lighting circuit.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, energy efficiency of the building automation systems is an important consideration in building automation and control. In current implementations of building automation systems, various wired and wireless building automation and control protocols that enable energy efficient management of building automation systems are utilized. For example, if we take the case of lighting control systems, efficiency of a typical LED driver is reduced at light loads, that is, at less than 50% dimming. In order to save energy in lighting systems, protocols for lighting control systems should enable to control the dimming percentage. Current commercial lighting control systems utilize protocols, for example, a digital addressable lighting interface (DALI) standard that facilitates to logically address the nodes, for example, lighting units, individually or as a group and program various schemes of lighting control (e.g., dimming control) and energy management. However, DALI protocol requires two wires for data transfer in addition to mains cables for power transfer, and therefore can be costlier for smaller networks. Further, other existing protocols for lighting control systems, for example, phase cut dimming and 1-10V protocols are simpler to realize, but cannot be addressed logically. Therefore, in order to overcome the above issues, a method and an apparatus for a low cost yet addressable network system that enables energy efficient management of building automation systems in smaller networks, for example, home networks is proposed in this disclosure.

Various embodiments described herein facilitate to provide energy efficient management of building automation systems in smaller networks, for example, home networks. In particular, in one embodiment, a direct current (DC) control system that enables energy efficient management of building automation systems in smaller networks, for example, home networks, is disclosed. In some embodiments, the building automation systems include DC motor loads, sensors, lighting systems etc. In another embodiment of the disclosure, a lighting control system that enables energy efficient management of lighting systems (e.g., LED lighting) in smaller networks, for example, home networks, is disclosed. In some embodiments, the lighting control system proposed herein provides a low cost alternative to the DALI system based on multiplexing both power and data transfer over a DC powerline. In some embodiments, the lighting control system proposed herein enables to eliminate the mains cables associated with the DALI system, further reducing the conversion losses associated therewith.

FIG. 1 illustrates a simplified block diagram of a control system 100, according to one embodiment of the disclosure. In some embodiments, the control system 100 enables energy efficient management of building automation systems. In some embodiments, the building automation systems include DC motor loads, sensors, lighting control systems etc. The control system 100 comprises a source circuit 102, a load circuit 106 and a transmission circuit 104 coupled between the load circuit 106 and the source circuit 102. In some embodiments, the transmission circuit 104 can be a separate entity, however, in other embodiments, the transmission circuit 104 can be part of the source circuit 102 or the load circuit 106. In some embodiments, the source circuit 102 and the load circuit 106 comprise transceiver modules capable of transmitting and receiving information. In some embodiments, source circuit 102 is configured to generate a modulated DC control signal 103 based on modulating a carrier signal, for controlling the load circuit 106. In some embodiments, the modulated DC control signal 103 comprises data that comprises control information and address information associated with the load circuit 106. In some embodiments, a frequency of the carrier signal is modulated to encode a first information associated with the data, for example, the address information, on to the carrier signal and a pulse width of the carrier signal is modulated to encode a second information associated with the data, for example, the control information, on to the carrier signal, within the source circuit, thereby generating a modulated carrier signal (not shown) comprising data.

In some embodiments, modulating both the frequency (i.e., frequency modulation) and the pulse width of the carrier signal enables to encode both the control information and the address information associated with the load circuit on a single data packet. In some embodiments, the modulated carrier signal is further coupled on to a DC source signal within the source circuit to generate the modulated DC control signal 103. In such embodiments, the modulated DC control signal 103 comprises a power associated with it for powering the load circuit 106. In some embodiments, the source circuit 102 can comprise a power supply circuit (not shown) to provide the DC source signal. In some embodiments, the power supply circuit could be powered from an AC grid or a DC grid (e.g., solar, battery sources etc.) and further comprises circuitry for down conversion, for example, AC-DC or DC-DC to provide the required voltage level for the transmission circuit 104 and to provide required regulated power for loads. The source circuit 102 is further configured to provide the generated modulated DC control signal 103 comprising the data and the power, to the load circuit 106 via the transmission circuit 104. In some embodiments, the source circuit 102 is further configured to receive an acknowledge signal from the load circuit 102, in response to providing the modulated DC control signal 103. In some embodiments, the transmission circuit 104 comprises a DC powerline for transferring the modulated DC control signal 103 from the source circuit 102 to the load circuit 106. In such embodiments, both power and data for the load circuit 106 are multiplexed over the DC powerline.

The load circuit 106 is configured to receive the modulated DC control signal 103 from the source circuit 102 over the DC powerline and process the received modulated DC control signal 103. In some embodiments, processing the modulated DC control signal 103 comprises decoding the control information and the address information in the modulated DC control signal 103. In some embodiments, the load circuit 106 is further configured to provide an acknowledge signal to the source circuit 102, in response to receiving the modulated DC control signal 103. In some embodiments, the acknowledge signal comprises an acknowledge message and/or status bits associated with the load circuit 106. In some embodiments, the load circuit 106 comprises one or more DC loads associated therewith. However, other types of loads, for example, AC loads or DC-AC in built loads are also contemplated to be within the scope of this disclosure. Further, in some embodiments, the load circuit 106 comprises a demodulation circuitry (not shown) for demodulating the modulated DC control signal 103 in order to retrieve the control information and the address information in the modulated DC control signal 103.

Figure 2A:
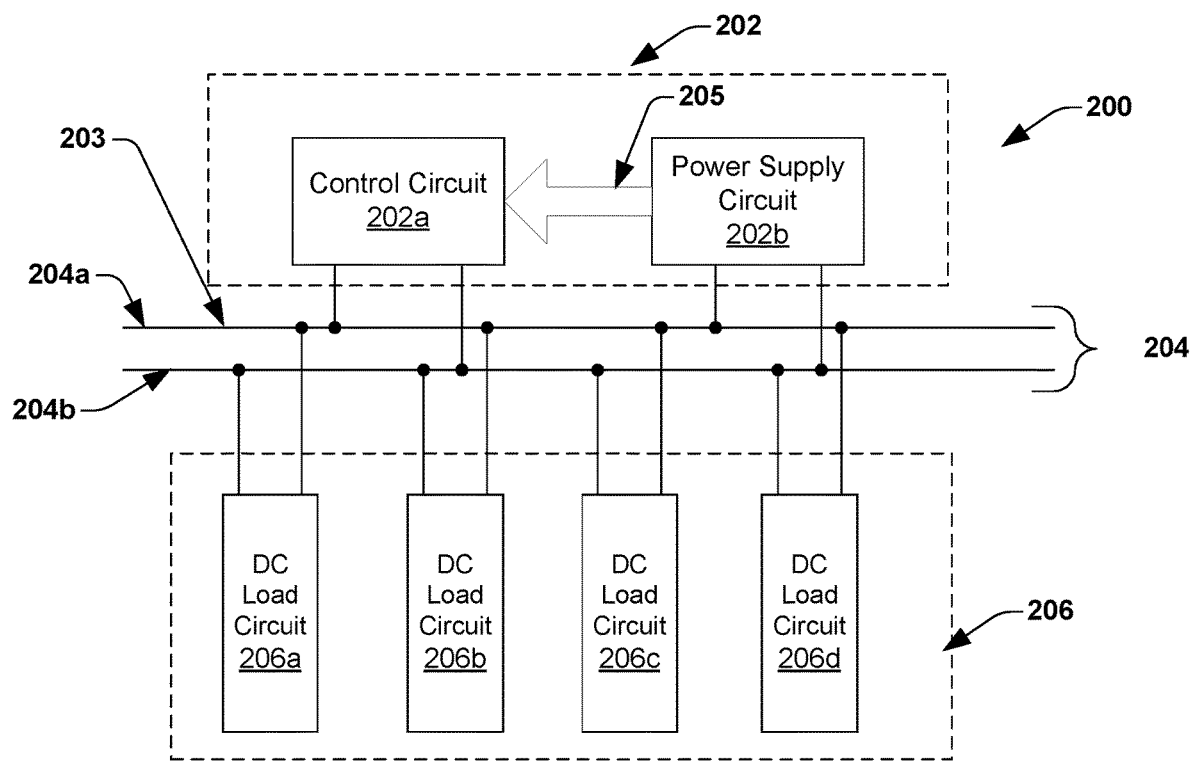
FIG. 2a illustrates a block diagram of a control system 200 that enables energy efficient management of building automation systems, according to one embodiment of the disclosure.

FIG. 2a illustrates a block diagram of a control system 200 that enables energy efficient management of building automation systems, according to one embodiment of the disclosure. The control system 200 comprises a source circuit 202, a load circuit 206 and a transmission circuit 204 coupled between the source circuit 202 and the load circuit 206. In some embodiments, the control system 200 could be utilized for the energy efficient management of lighting control systems, sensor controls, DC motor loads etc. The source circuit 202 is configured to generate a modulated DC control signal 203 comprising data and power, based on modulating a carrier signal for controlling the load circuit 206.

Figure 2B:
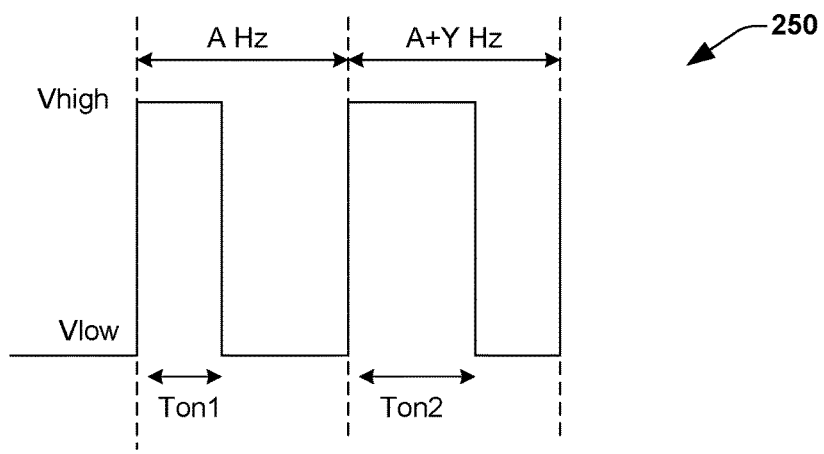
FIG. 2b depicts an example illustration of a modulated carrier signal, according to one embodiment of the disclosure.

In some embodiments, the data encoded in the modulated DC control signal 203 comprises a first information, for example, an address information and/or associated status bits and a second information, for example, a control information (e.g., speed percentage, dimming ratio etc.) associated with the load circuit 206. In some instances, the first information can comprise the control information and the second information can comprise the address information and/or associated status bits. In some embodiments, the source circuit 202 further comprises a control circuit 202a and power supply circuit 202b coupled to the control circuit 202a. In some embodiments, the power supply circuit 202b can be a separate entity, however, in other embodiments, the power supply circuit 202b could be part of the control circuit 202a. In some embodiments, the control circuit 202a is configured to encode both the first information and the second information associated with the load circuit 206 on to the carrier signal, in order to generate a modulated carrier signal (as shown in FIG. 2b) within the control circuit 202a. In some embodiments, encoding both the first information and the second information on to a single carrier signal or a single data packet is made possible by combining frequency modulation/frequency shift keying (e.g., binary frequency shift keying) and pulse width modulation on the single carrier signal/data packet. For example, a frequency of the carrier signal is modulated to encode the first information associated with the data onto the carrier signal and a pulse width of the carrier signal is modulated to encode the second information associated with the data onto the carrier signal. In one example embodiment, the frequency of the carrier signal is modulated in accordance with binary frequency shift keying (FSK) to generate a modulated FSK carrier and the pulse width of the modulated FSK carrier is modulated to generate the modulated DC control signal 203. However, in other embodiments, other kinds of frequency modulation can also be utilized. In some embodiments, the carrier signal is generated within the control circuit 202a.

The power supply circuit 202b is configured to generate a DC source signal 205 in order to supply power to the load circuit 206. In some embodiments, the control circuit 202a is further configured to receive the DC source signal 205 and couple the modulated carrier signal comprising the data onto the DC source signal 205, thereby generating the modulated DC control signal 203. In some embodiments, the source circuit 202 is further configured to provide the modulated DC control signal 203 to the load circuit 206 using the transmission circuit 204. In some embodiments, the source circuit 202 is further configured to receive an acknowledge signal from the load circuit 206, in response to providing the modulated DC control signal 203. In some embodiments, the transmission circuit 204 comprises a DC power line comprising a first wire 204a of positive polarity and a second wire 204b of negative polarity. In some embodiments, the DC powerline is configured to transfer the modulated DC control signal 203 from the source circuit 202 to the load circuit 206.

In some embodiments, providing the modulated DC control signal 203 over the DC powerline comprises multiplexing both the power and the data required by the load circuit 206 over the DC powerline. In some embodiments, encoding both the first information and the second information on to the single carrier signal or the single data packet enables the multiplexing of both the power and the data over the DC powerline. In some embodiments, multiplexing both the power and the data over the DC powerline eliminates the need for separate data cables and power cables in the current implementations of building automation systems, implemented in accordance with existing protocols.

The load circuit 206 is coupled to the DC powerline and is configured to process the modulated DC control signal 203. The load circuit 206 comprises four DC load circuits, for example, 206a, 206b, 206c and 206d coupled in parallel to the DC powerline. However, in other embodiments, the load circuit 206 can comprise any number of DC load circuits, for example, 1 to N, depending on the current carrying capacity of the DC powerline. In some embodiments, the DC load circuits can comprise one or more DC loads associated therewith. In some embodiments, the DC load circuits can include DC motor loads, LED lighting circuits, sensor circuits etc. In some embodiments, the address information encoded in the modulated DC control signal 203 identifies the DC load circuits 206a, 206b, 206c or 206d to be controlled, and the control information encoded in the modulated DC control signal 203 identifies a value of a control parameter, for example, speed, dimming ratio etc. to be applied to the respective DC load circuit. In some embodiments, the load circuit 206 further comprise a demodulation circuitry (not shown) for demodulating the modulated DC control signal 203 in order to retrieve the control information and the address information in the modulated DC control signal 203. In some embodiments, the load circuit 206 can comprise a single demodulation circuit. However, in other embodiments, the load circuit 206 can comprise a plurality of demodulation circuits each of which is associated with a respective DC load circuit. In some embodiments, the load circuit 206 is further configured to provide an acknowledge signal to the source circuit 202 over the DC powerline, in response to receiving the modulated DC control signal 203. In some embodiments, the acknowledge signal comprises an acknowledge message and/or status bits associated with the load circuit 206.

FIG. 2b depicts an example illustration of a modulated carrier signal 250 (as indicated in FIG. 2a above), according to one embodiment of the disclosure. In some embodiments, the modulated carrier signal 250 comprises a first information and a second, different, information associated with a data. In some embodiments, the modulated carrier signal 250 is generated by means of combining frequency modulation and pulse width modulation on a single carrier signal. In some embodiments, the modulated carrier signal 250 comprises a first frequency A kHz and a second frequency A+Y kHz. In some embodiments, the variation of the frequency of the carrier signal is a result of frequency modulation and represents the first information associated with the data. In some embodiments, the frequency modulation comprises binary frequency shift keying (binary FSK), which uses a pair of discrete frequencies to transmit binary information. However, in other embodiments, other kinds of frequency modulation can be utilized to represent the first information associated with the data. In particular, in embodiments that utilize binary FSK, the "0" bit is transmitted using the A kHz carrier and the "1" bit is transmitted using the A+Y kHz carrier of the modulated carrier signal 250.

In addition to the frequency modulation, in some embodiments, the duty cycle ratio or the pulse width of the carrier signal is also varied. In some embodiments, the variation of the pulse width of the carrier signal represents the second information associated with the data. The modulated carrier signal 250 comprises an ON period of Ton1 for the A kHz carrier and an ON period of Ton2 for the A+Y kHz carrier. In some embodiments, an average value of the Ton over the modulated carrier signal 250 represents the second information associated with the data. For example, $$\text{Average Ton} = \Sigma \text{Ton over frame length/frame size} \quad (1)$$

where frame length and frame size are measurements corresponding to a data packet comprising the modulated carrier signal 250. In some embodiments, the frame length includes the number of bits utilized to encode data and frame size includes the frame length and/or some additional status/control bits. In some embodiments, the frame length and the frame size could be the same.

In some embodiments, the ON or OFF periods of either the A kHz carrier or the A+Y kHz carrier is varied to represent the second information associated with the data. However, in other embodiments, the ON or OFF period of both the A kHz carrier and the A+Y kHz carrier can be varied to represent the second information associated with the data. In some embodiments, information comprised in the pulse width of the modulated carrier signal 250 can be determined based on a simple averaging of the pulse width, without the need for any microcontroller at a demodulation circuitry.

Figure 3A:
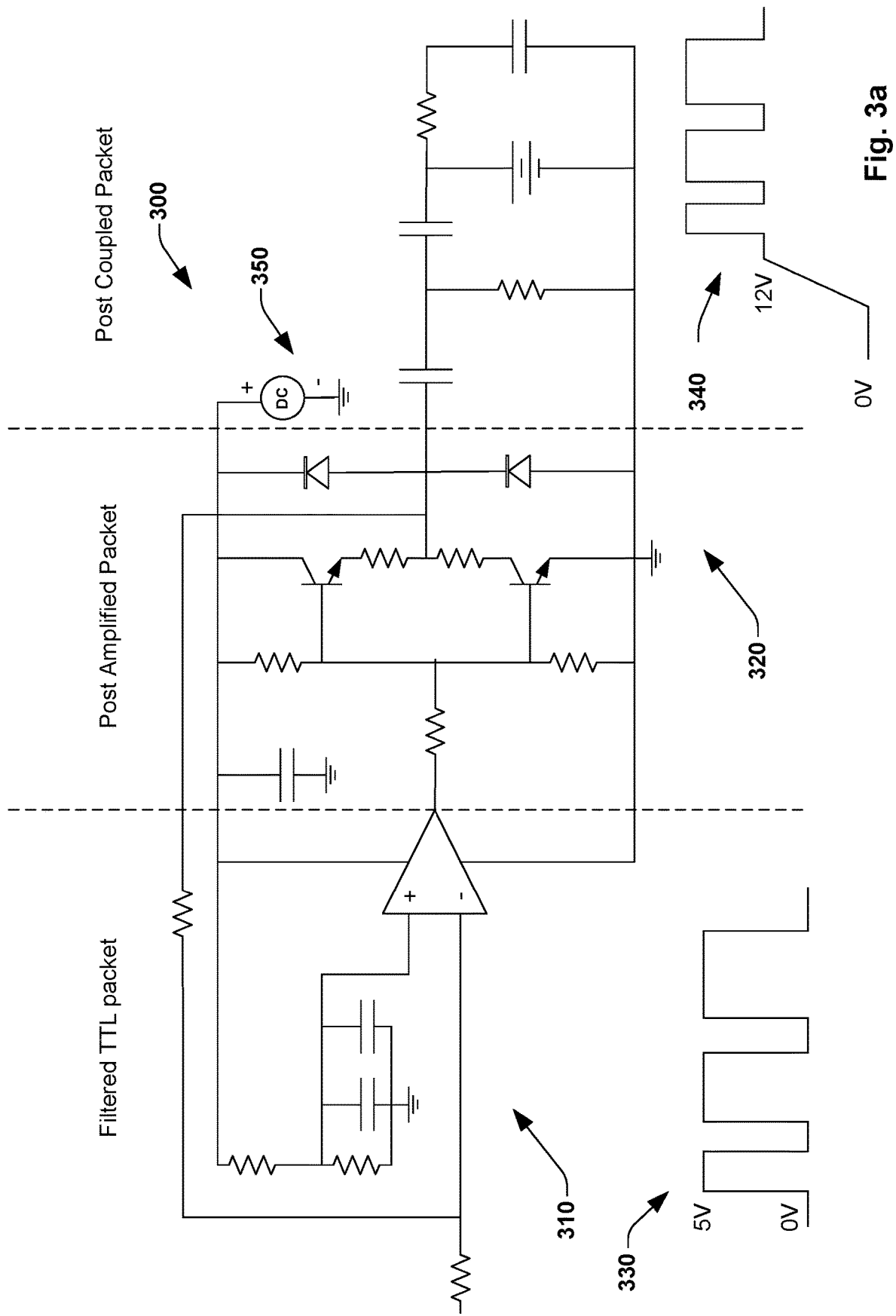
FIG. 3a illustrates an example implementation of physical layer of a control circuit, according to one embodiments of the disclosure.

FIG. 3a illustrates an example implementation of a physical layer of a control circuit 300, according to one embodiment of the disclosure. In some embodiments, the control circuit 300 is similar to the control circuit 202a in FIG. 2a above. However, other implementations of the control circuit 202a are also contemplated to be within the scope of this disclosure. The control circuit 300 is configured to generate a modulated DC control signal 340 having data and power associated with it. In some embodiments, the modulated DC control signal 340 is similar to the modulated DC control signal 203 in FIG. 2a. In some embodiments, the control circuit 300 comprises a microcontroller hardware peripheral (not shown), for example, a capture compare unit, a pulse width modulator or a digital to analog converter (DAC), configured to generate a modulated carrier signal 330 as an input to the control circuit 300. In some embodiments, the modulated carrier signal comprises data packets or packed time-to-live (TTL) frames comprising the data.

In some embodiments, the modulated carrier signal 330 is similar to the modulated carrier signal 250 explained above with respect to FIG. 2b. In some embodiments, a frequency of the modulated carrier signal 330 comprises a first information associated with a data and a pulse width of the modulated carrier signal 330 comprises a second, different, information associated with the data. The modulated carrier signal 330 is then filtered and sent to a power amplifier circuitry 310 configured to amplify the modulated carrier signal 330. The amplified signal (not shown) is then sent to a coupling circuitry 320 configured to couple the amplified signal with a DC source signal 350 in order to generate the modulated DC control signal 340. In some embodiments, the DC source signal 350 is provided by a power supply circuit similar to the power supply circuit 202b in FIG. 2a.

Figure 3B:
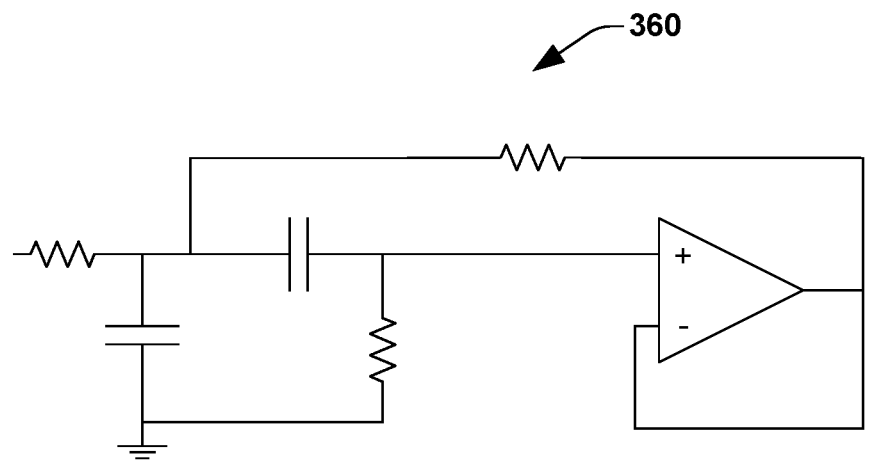
FIG. 3b illustrates an example implementation of a signal filter circuit which is a part of a demodulation circuitry associated with a load circuit in building automation systems, according to one embodiment of the disclosure.

FIG. 3b illustrates an example implementation of a signal filter circuit 360 which is a part of a demodulation circuitry associated with a load circuit in building automation systems, according to one embodiment of the disclosure. However, other implementations of the signal filter circuit 360 are also contemplated. In some embodiments, the signal filter circuit 360 handles the physical layer processing of a signal. In some embodiments, the apparatus 360 could be part of the demodulation circuitry indicated above with respect to FIG. 2a. In some embodiments, the signal filter circuit 360 comprises a band pass filter configured to filter frequencies in a certain frequency band. In some embodiments, the signal filter circuit 360 further comprises amplification, impedance matching and signal conditioning circuits for physical layer processing. In some embodiments, the demodulation circuitry further comprises circuitry capable of decoding a modulated signal (e.g., the modulated DC control signal 203 in FIG. 2a).

Figure 4:
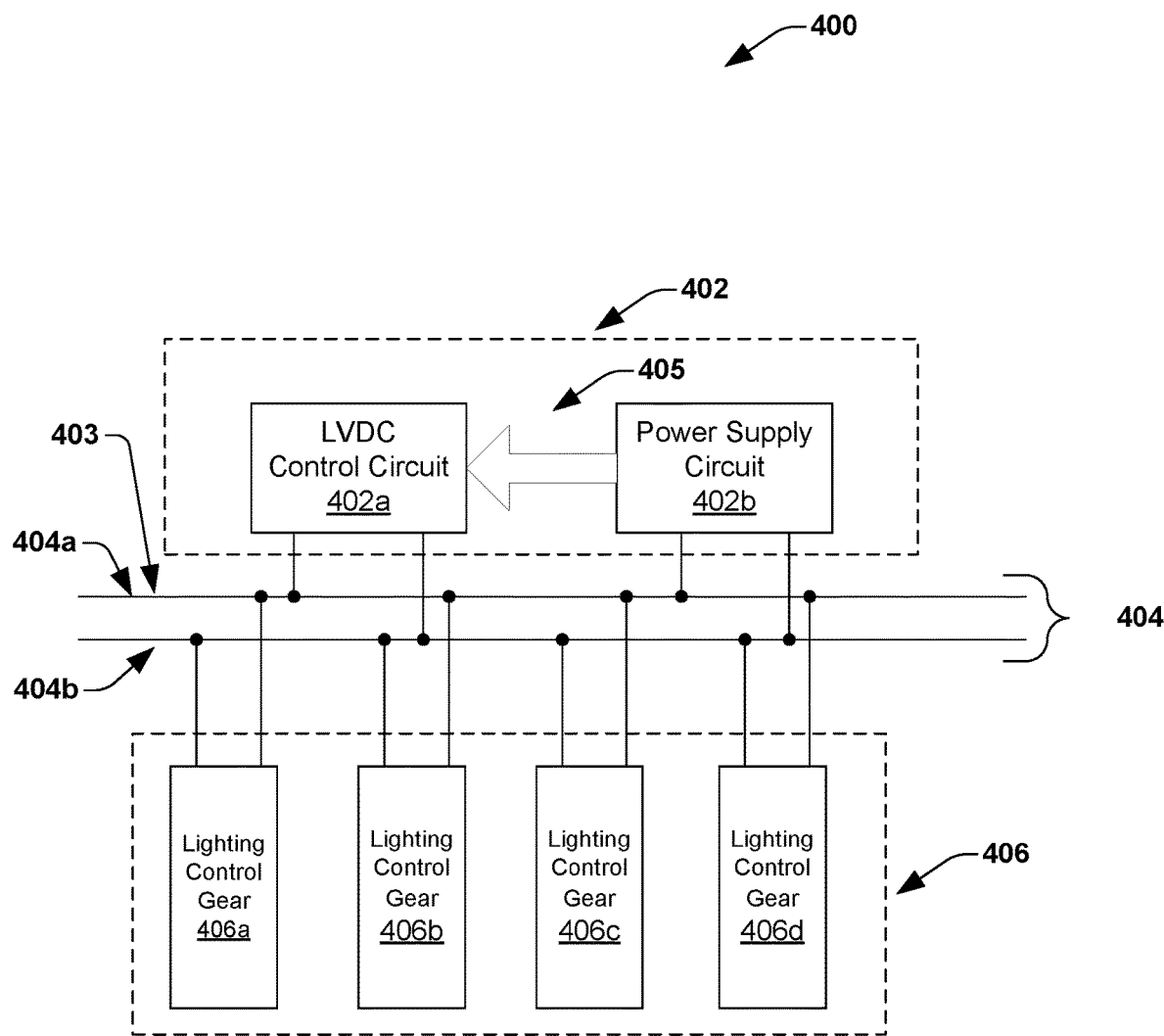
FIG. 4 illustrates an example implementation of a control system that enables energy efficient management of lighting control systems, according to one embodiment of the disclosure.

FIG. 4 illustrates an example implementation of a control system 400 that enables energy efficient management of lighting control systems, according to one embodiment of the disclosure. In some embodiments, the control system 400 is similar to the control system 200 in FIG. 2a. The control system 400 comprises a source circuit 402, a load circuit 406 and a transmission circuit 404 coupled between the source circuit 402 and the load circuit 406. In some embodiments, the control system 400 could be utilized for the energy efficient management of lighting control systems, for example LED lighting. The source circuit 402 is configured to generate a modulated DC control signal 403 comprising data for controlling the load circuit 406, based on modulating a carrier signal. The source circuit 402 is further configured to provide the generated modulated DC control signal 403 to the load circuit 406 using the transmission circuit 404. In some embodiments, the source circuit 402 is further configured to receive an acknowledge signal from the load circuit 406, in response to providing the modulated DC control signal 403. In some embodiments, the transmission circuit 404 comprises a DC powerline comprising a first wire 404a of positive polarity and a second wire 404b of negative polarity. The load circuit 406 comprises a lighting circuit comprising four lighting control gears/circuits 406a, 406b, 406c and 406d coupled in parallel to the DC powerline. However, in other embodiments, the load circuit 406 can comprise any number of lighting control gears 1 to N, based on the current carrying capacity of the DC powerline. In some embodiments, each of the lighting control gears/circuits 406a, 406b, 406c and 406d has a unique address associated therewith. In some embodiments, the lighting control gears 406a, 406b, 406c and 406d comprises LED driver circuits for controlling one or more LED lighting units respectively associated therewith.

In some embodiments, the data encoded in the modulated DC control signal 403 comprises an address information and a dimming information associated with the load circuit 406. In some embodiments, the address information in the modulated DC control signal 403 identifies the lighting control gears/circuits 406a, 406b, 406c and/or 406d that needs to be controlled, and the dimming information in the modulated DC control signal 403 identifies the dimming percentage to be applied to the respective lighting control gears/circuits 406a, 406b, 406c and/or 406d. In some embodiments, the source circuit 402 comprises a control circuit 402a and a direct current (DC) power supply circuit 402b coupled to the control circuit 402a. In some embodiments, the control circuit 402a is configured to encode both the address information and the dimming information associated with the lighting control gears 406a, 406b, 406c and 406d on to the carrier signal, in order to generate a modulated carrier signal (as shown in FIG. 2b) within the control circuit 402a. In some embodiments, encoding both the address information and the dimming information on to a single carrier signal or a single data packet is made possible by combining frequency modulation (e.g., binary frequency shift keying) and pulse width modulation on the single carrier signal/data packet.

In particular, a frequency of the carrier signal is modulated to encode the address information associated with the lighting control gears 406a, 406b, 406c and 406d onto the carrier signal and a pulse width of the carrier signal is modulated to encode the dimming information associated with the lighting control gears 406a, 406b, 406c and 406d onto the carrier signal. In some embodiments, the frequency of the carrier signal is modulated to encode some status bits associated with the lighting control gears in addition to the address information. In one example embodiment, the frequency of the carrier signal is modulated in accordance with binary frequency shift keying (FSK) to generate a modulated FSK carrier and the pulse width of the modulated FSK carrier is modulated to generate the modulated DC control signal 403. However, in other embodiments, other kinds of frequency modulation can also be utilized.

Further, in some embodiments, the frequency of the carrier signal can be modulated to encode the dimming information associated with the lighting control gears 406a, 406b, 406c and 406d onto the carrier signal and the pulse width of the carrier signal can be modulated to encode the addressing information/status bits associated with the lighting control gears 406a, 406b, 406c and 406d onto the carrier signal. In some embodiments, the carrier signal is generated within the control circuit 402a. The power supply circuit 402b is configured to generate a DC source signal 405 in order to supply power to the load circuit 406. In some embodiments, the control circuit 402a is further configured to receive the DC source signal 405 from the power supply circuit 402b and couple the modulated carrier signal comprising the data onto the DC source signal 405, thereby generating the modulated DC control signal 403.

In some embodiments, providing the modulated DC control signal 403 over the DC powerline comprises multiplexing both the power and the data required by the load circuit 406 over the DC powerline. In some embodiments, encoding both the address information and the dimming information on to the single carrier signal or the single data packet enables the multiplexing of both the power and the data over the DC powerline. In some embodiments, multiplexing of both the power and the data over the DC powerline eliminates the need for separate data cables and power cables in the current implementations of lighting control systems, for example, digital addressable lighting interface (DALI) systems, implemented in accordance with DALI protocols.

The load circuit 406 is coupled to the DC powerline and is configured to process the modulated DC control signal 403. In some embodiments, the load circuit 406 is further configured to provide an acknowledge signal to the source circuit 402 over the DC powerline, in response to receiving the modulated DC control signal 403. In some embodiments, the acknowledge signal comprises an acknowledge message and/or status bits associated with the load circuit 406. In some embodiments, the load circuit 406 further comprises a demodulation circuitry (not shown) for demodulating the modulated DC control signal 403 in order to retrieve the address information and the dimming information in the modulated DC control signal 403. In some embodiments, the demodulation circuitry can be similar to the demodulation circuitry explained above with respect to FIG. 3b. In embodiments where the dimming ratio of the lighting circuit is encoded based on modulating the pulse width of the carrier signal, averaging the pulse width value of the modulated DC control signal 403 at the demodulation circuitry enables to determine the dimming ratio. In some embodiments, the load circuit 406 can comprise a single demodulation circuitry. However, in other embodiments, the load circuit 406 can comprise a plurality of demodulation circuitry each of which is associated with respective lighting control gears 406a, 406b, 406c and 406d.

Figure 5:
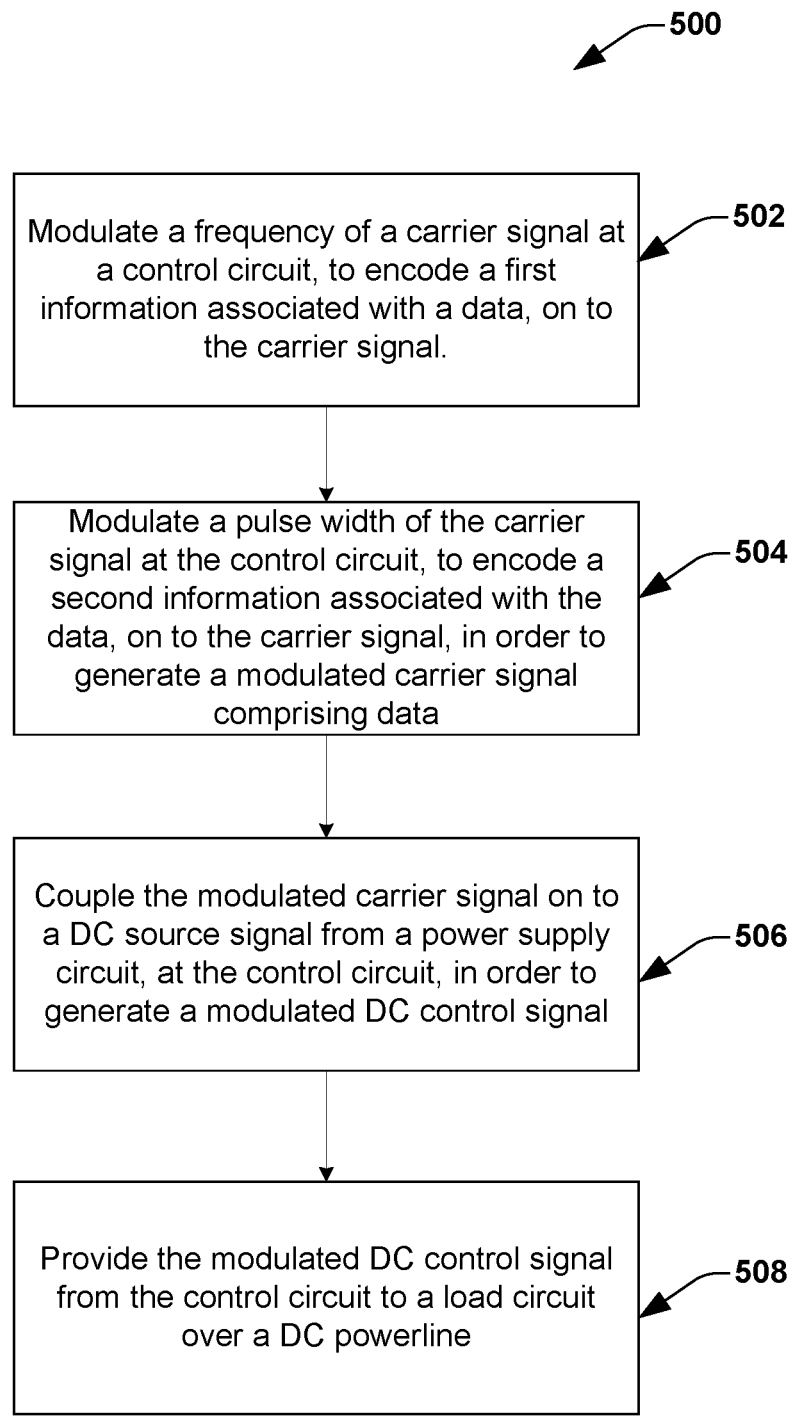
FIG. 5 illustrates a flow chart of a method for a control system in building automation systems, according to one embodiment of the disclosure.

FIG. 5 illustrates a flow chart of a method 500 for a control system in building automation systems, according to one embodiment of the disclosure. The method 500 is explained herein with reference to the control system 200 in FIG. 2a. At 502, a frequency of a carrier signal is modulated at a control circuit, to encode a first information associated with a data, on to the carrier signal. In some embodiments, the first information comprises an address information associated with a load circuit, however, in other embodiments, the first information comprises a control information associated with the load circuit. At 504, a pulse width of the carrier signal is modulated at the control circuit, to encode a second information associated with the data, on to the carrier signal, in order to generate a modulated carrier signal comprising data. In some embodiments, the second information comprises a control information associated with the load, however, in other embodiments, the second information comprises an address information associated with the load circuit. At 506, the modulated carrier signal is coupled on to a DC source signal from a power supply circuit, at the control circuit, in order to generate a modulated DC control signal. At 508, the modulated DC control signal is provided by the control circuit to the load circuit over a DC powerline.

Figure 6:
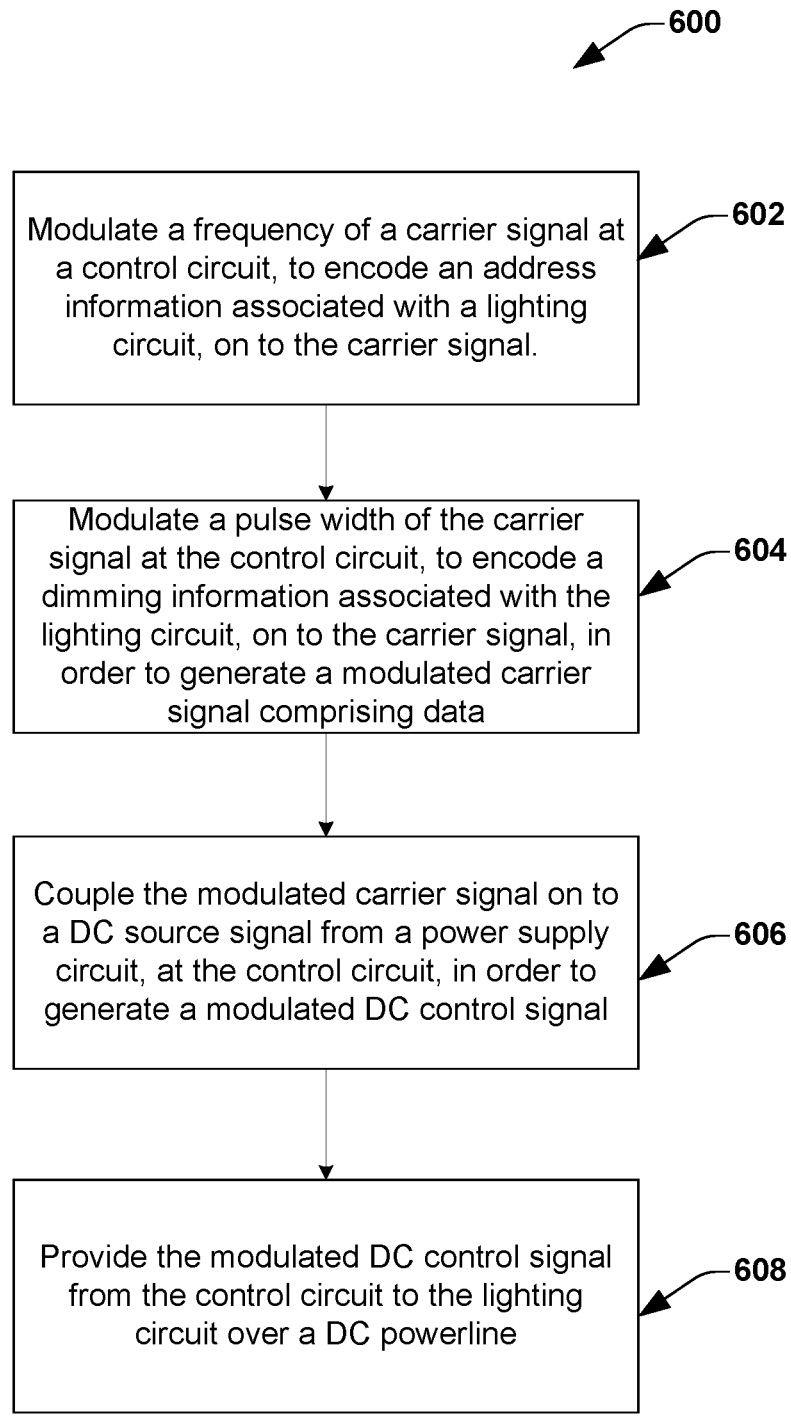
FIG. 6 illustrates a flow chart of a method for a control system in a lighting control system, according to one embodiment of the disclosure.

FIG. 6 illustrates a flow chart of a method 600 for a control system in a lighting control system, according to one embodiment of the disclosure. The method 600 is explained herein with reference to the lighting control system 400 in FIG. 4. At 602, a frequency of a carrier signal is modulated at a control circuit, to encode an address information associated with a lighting circuit, on to the carrier signal. At 604, a pulse width of the carrier signal is modulated at the control circuit, to encode an address information associated with the lighting circuit, on to the carrier signal, in order to generate a modulated carrier signal comprising data. Alternately, in other embodiments, the frequency of the carrier signal can be modulated at the control circuit, to encode a dimming information associated with the lighting circuit and the pulse width of the carrier signal can be modulated at the control circuit, to encode the addressing information associated with the lighting circuit. At 606, the modulated carrier signal is coupled on to a DC source signal from a power supply circuit, at the control circuit, in order to generate a modulated DC control signal. At 608, the modulated DC control signal is provided by the control circuit to the lighting circuit over a DC powerline.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A direct current (DC) control system, comprising:
a source circuit configured to generate a modulated DC control signal comprising data modulated on a DC source signal having a power associated therewith;
a load circuit configured to receive the modulated DC control signal; and
a transmission circuit comprising a DC powerline, coupled between the load circuit and the source circuit, and configured to transfer the modulated DC control signal from the source circuit to the load circuit, thereby multiplexing both the power and the data transfer over the DC powerline;
wherein a frequency of the modulated DC control signal comprises a first information associated with the data, and a pulse width of the modulated DC control signal comprises a second, different information associated with the data; and
wherein the source circuit comprises a control circuit configured to generate a modulated carrier signal comprising the data by modulating a frequency of a carrier signal, to encode the first information associated with the data and modulating a pulse width of the carrier signal, to encode the second information associated with the data; and couple the generated modulated carrier signal on to the DC source signal, to generate the modulated DC control signal.

2. The control system of claim 1, wherein the source circuit further comprises a power supply circuit coupled to the control circuit configured to generate the DC source signal for powering the load circuit.

3. The control system of claim 1, wherein the load circuit comprises one or more DC load circuits coupled in parallel to the DC powerline, wherein the DC load circuit comprises one or more DC loads associated therewith.

4. The control system of claim 3, wherein the load circuit is configured to demodulate the received modulated DC control signal to recover the data associated with the modulated DC control signal and utilize the recovered data for controlling the one or more DC loads.

5. The control system of claim 3, wherein the DC load circuit comprises a lighting control circuit associated with one or more lighting units.

6. The control system of claim 5, wherein the first information comprises an addressing data associated with the lighting control circuit and the second information comprises a dimming data associated with the lighting control circuit.

7. The control system of claim 1, wherein the DC powerline comprises a first wire of positive polarity and a second wire of negative polarity.

8. The control system of claim 1, wherein the first information comprises an address information associated with the load circuit and the second information comprises a control information associated with the load circuit.

9. The control system of claim 1, wherein the first information comprises a control information associated with the load circuit and the second information comprises an address information associated with the load circuit.

10. A lighting control system, comprising:
a power supply circuit configured to generate a DC source signal having a power associated therewith;

a control circuit coupled to the power supply circuit and configured to generate a modulated DC control signal comprising data modulated on the DC source signal; and a lighting circuit, comprising one or more lighting control circuits, configured to receive the modulated DC control signal over a DC powerline coupled between the control circuit and the lighting circuit, thereby multiplexing both the power and the data over the DC powerline;

wherein a frequency of the modulated DC control signal comprises a first information associated with the data, and a pulse width or of the modulated DC control signal comprises a second information associated with the data that is different than the first information; and wherein generating the modulated DC control signal at the control circuit comprises generating a modulated carrier signal comprising the data at the control circuit, by modulating a frequency of a carrier signal, to encode the first information associated with the data and modulating a pulse width or of the carrier signal, to encode the second information associated with the data; and coupling the generated modulated carrier signal on to the DC source signal, to generate the modulated DC control signal.

11. The control system of claim 10, wherein the first information comprises an addressing data associated with the one or more lighting control circuits and the second information comprises a dimming data associated with the one or more lighting control circuits.

12. The control system of claim 10, wherein each of the one or more lighting control circuits comprises one or more lighting units associated therewith.

13. The control system of claim 10, wherein modulating the frequency of the carrier signal comprises modulating the frequency in accordance with binary frequency shift keying (FSK) to generate a modulated FSK carrier.

14. The control system of claim 13, wherein modulating the pulse width or of the carrier signal comprises modulating the pulse width or of the modulated FSK carrier.

15. A method for a direct current (DC) control system, comprising:

generating, at a control circuit, a modulated carrier signal comprising data, based on modulating a frequency of a carrier signal to encode a first information associated with the data, and modulating a pulse width of the carrier signal to encode a second, different, information associated with the data, generating, at the control circuit, a modulated DC control signal by coupling the generated modulated carrier signal on to a DC source signal having a power associated therewith; and providing the modulated DC control signal to a load circuit over a DC powerline, thereby multiplexing both the power and the data transfer over the DC powerline, wherein the load circuit comprises a lighting circuit, comprising one or more lighting control circuits, and wherein the first information comprises an addressing data associated with the one or more lighting control circuits and the second information comprises a dimming data associated with the one or more lighting control circuits.

16. The method of claim 15, wherein modulating the frequency of the carrier signal comprises modulating the frequency in accordance with binary frequency shift keying (FSK) to generate a modulated FSK carrier and modulating the pulse width of the carrier signal comprises modulating the pulse width or of the modulated FSK carrier.

* * * * *